United States Patent
Tae (10) Patent No.: US 9,069,044 B2
(45) Date of Patent: Jun. 30, 2015

(54) BATTERY MANAGEMENT SYSTEM AND METHOD OF CONTROLLING THE SAME

(75) Inventor: Yong-Jun Tae, Yongin-si (KR)

(73) Assignees: Samsung SDI Co., Ltd., Giheung-gu, Yongin-si, Gyeonggi-do (KR); ROBERT BOSCH GMBH, Stuttgart (DE)

( * ) Notice: Subject to any disclaimer, the term of this patent is extended or adjusted under 35 U.S.C. 154(b) by 291 days.

(21) Appl. No.: 13/540,338

(22) Filed: Jul. 2, 2012

(65) Prior Publication Data

US 2013/0009648 A1 Jan. 10, 2013

(30) Foreign Application Priority Data

Jul. 4, 2011 (KR) .................. 10-2011-0066121

(51) Int. Cl.
*G01R 31/00* (2006.01)
*G01R 31/327* (2006.01)
*G01R 31/36* (2006.01)

(52) U.S. Cl.
CPC .......... *G01R 31/3278* (2013.01); *G01R 31/007* (2013.01); *G01R 31/006* (2013.01); *G01R 31/3658* (2013.01)

(58) Field of Classification Search
CPC ............. G01R 31/3658; G01R 31/007; G01R 31/025; G01R 31/3278; G01R 31/3624; B60L 3/0046; B60L 3/003; B60L 11/1861; Y02T 10/7005; Y02T 10/7077; Y02T 10/70; Y02T 10/7044; H01M 10/425; H01M 2010/4271; H02J 7/0021; Y02E 60/12; Y10S 903/907

USPC ............. 324/503, 418, 421, 764.01; 701/29, 701/33.7–33.9; 340/635, 636.1–636.21; 361/78, 79

See application file for complete search history.

(56) References Cited

U.S. PATENT DOCUMENTS

| | | | | |
|---|---|---|---|---|
| 5,781,013 | A * | 7/1998 | Takahashi | 324/426 |
| 6,696,815 | B1 * | 2/2004 | Kikuchi | 320/104 |
| 7,557,583 | B2 * | 7/2009 | Zettel et al. | 324/418 |
| 7,573,150 | B2 * | 8/2009 | Hirasawa | 307/9.1 |
| 7,688,074 | B2 * | 3/2010 | Cox et al. | 324/426 |
| 7,705,602 | B2 * | 4/2010 | Bertness | 324/426 |
| 8,004,249 | B2 * | 8/2011 | Lim et al. | 320/166 |
| 8,264,201 | B2 * | 9/2012 | Tae et al. | 320/118 |
| 8,278,882 | B2 * | 10/2012 | Gotou et al. | 320/163 |
| 8,307,223 | B2 * | 11/2012 | Tae et al. | 713/300 |
| 8,624,601 | B2 * | 1/2014 | Kimes et al. | 324/422 |

(Continued)

FOREIGN PATENT DOCUMENTS

| | | | | |
|---|---|---|---|---|
| JP | 10-144194 | | 5/1998 | |
| JP | 11341821 | A * | 12/1999 | H02M 7/48 |

(Continued)

OTHER PUBLICATIONS

Machine translation of JP 2010-161009.*

(Continued)

*Primary Examiner* — Patrick Assouad
*Assistant Examiner* — Sean Curtis
(74) *Attorney, Agent, or Firm* — Robert E. Bushnell, Esq.

(57) ABSTRACT

A battery management system (BMS) and a method of controlling the BMS, which are capable of increasing reliability of determination of a defect of a relay by considering not only a voltage of a battery and a voltage of an inverter but also a current between the battery and the inverter and information regarding an operational state of the relay.

13 Claims, 5 Drawing Sheets

(56) References Cited

U.S. PATENT DOCUMENTS

| | | | |
|---|---|---|---|
| 2004/0061503 A1* | 4/2004 | Morimoto | 324/418 |
| 2009/0319209 A1* | 12/2009 | Lim | 702/63 |
| 2010/0194354 A1* | 8/2010 | Gotou et al. | 320/163 |
| 2010/0244847 A1* | 9/2010 | Kudo et al. | 324/433 |
| 2010/0295382 A1* | 11/2010 | Tae et al. | 307/150 |
| 2010/0296204 A1* | 11/2010 | Ichikawa et al. | 361/15 |
| 2011/0022261 A1* | 1/2011 | Pushkolli et al. | 701/29 |
| 2011/0184677 A1* | 7/2011 | Tae et al. | 702/63 |
| 2012/0025769 A1* | 2/2012 | Kikuchi et al. | 320/118 |

FOREIGN PATENT DOCUMENTS

| | | | | | |
|---|---|---|---|---|---|
| JP | 2001136666 A | * | 5/2001 | | H02J 7/00 |
| JP | 2002-116819 A | | 4/2002 | | |
| JP | 2006-310219 A | | 11/2006 | | |
| JP | 2010-161009 A | | 7/2010 | | |
| KR | 10-0454921 B1 | * | 8/1997 | | H04M 1/24 |
| KR | 1020090109373 A | | 10/2009 | | |
| KR | 2010-0089518 A | | 8/2010 | | |
| KR | 10-2010-0105705 A | | 9/2010 | | |
| KR | 1020110026595 A | | 3/2011 | | |

OTHER PUBLICATIONS

Machine Translation of JP H11-341821.*
Machine Translation of KR 10-2011-0026595 A.*
Abstract of KR 10-0454921 B1.*
Korean Notice of Allowance issued by KIPO on Mar. 5, 2013 in the corresponding Korean Application No. 10-2011-0066121.

* cited by examiner

BATTERY MANAGEMENT SYSTEM AND METHOD OF CONTROLLING THE SAME

CLAIM OF PRIORITY

This application makes reference to, incorporates the same herein, and claims all benefits accruing under 35 U.S.C. §119 from an application earlier filed in the Korean Intellectual Property Office on the 4 of Jul. 2011 and there duly assigned Serial No. 10-2011-0066121.

BACKGROUND OF THE INVENTION

1. Field of the Invention

One or more embodiments of the present invention relate to a battery management system (BMS), and more particularly, to a BMS for determining a defect of a relay between an inverter and a battery used in a vehicle using electric energy, and a method of controlling the BMS.

2. Description of the Related Art

A vehicle that uses an internal combustion engine consuming gasoline or heavy oil as a main fuel causes significant pollution such as air pollution and the like. Thus, recently, in order to reduce pollution, much research with the aim of developing electric vehicles or hybrid vehicles has been actively conducted.

An electric vehicle uses a battery engine that operates using electric energy output from a battery. The electric vehicle uses the battery, in which a plurality of chargeable secondary battery cells are formed as one pack, as a main power source, so that the electric vehicle does not generate exhaust gas or much noise.

A hybrid vehicle indicates a medium type between an electric vehicle and a vehicle using an internal combustion engine, and uses two or more power sources, e.g., an internal combustion engine and a battery motor. Lately, a combination-type hybrid vehicle is being developed to use a fuel cell that directly obtains electric energy via a chemical reaction by sequentially supplying hydrogen and oxygen to an internal combustion engine, or to use a battery and a fuel cell.

SUMMARY OF THE INVENTION

One or more embodiments of the present invention include an improved battery management system (BMS).

One or more embodiments of the present invention include a BMS capable of improving reliability of determination about a relay defect by referring not only to a voltage of a battery and a voltage of an inverter but also by referring to a current between the battery and the inverter, and information regarding an operational state of the relay.

Additional aspects will be set forth in part in the description which follows and, in part, will be apparent from the description, or may be learned by practice of the presented embodiments.

According to one or more embodiments of the present invention, a battery management system (BMS) includes a relay connected between a battery and an inverter, a voltage determination unit for measuring a voltage of the battery and a voltage of the inverter, in response to a signal corresponding to a state of the relay, a current determination unit for measuring a current flowing between the battery and the inverter, in response to the signal corresponding to the state of the relay, and a relay defect determination unit for determining a defect of the relay according to the current and a difference between the voltage of the battery and the voltage of the inverter.

The relay may include a positive main relay, a negative main relay, and an auxiliary relay.

The relay defect determination unit may determine whether a driving voltage of the relay is normal, and if normal, may determine the defect of the relay according to the current and the difference between the voltage of the battery and the voltage of the inverter.

The relay may include a positive main relay, a negative main relay, and an auxiliary relay that is connected in parallel with the positive main relay.

According to a signal corresponding to an OFF state of the relay, the relay defect determination unit may determine that the relay is defective when an absolute value of the current is greater than a first critical value, or the difference between the voltage of the battery and the voltage of the inverter is less than a second critical value.

According to a signal corresponding to an ON state of the auxiliary relay, the relay defect determination unit may determine that the negative main relay is defective when the absolute value of the current flowing between the battery and the inverter is greater than the first critical value, or the difference between the voltage of the battery and the voltage of the inverter is less than the second critical value.

According to a signal corresponding to an ON state of the auxiliary relay, the relay defect determination unit may determine a defect of the negative main relay based on the current flowing between the battery and the inverter, and the difference between the voltage of the battery and the voltage of the inverter.

According to a signal corresponding to an OFF state of the auxiliary relay and a signal corresponding to an ON state of the negative main relay, the relay defect determination unit may determine a defect of the auxiliary relay or a defect of the positive main relay based on the current flowing between the battery and the inverter, and the difference between the voltage of the battery and the voltage of the inverter.

The relay defect determination unit may determine that the auxiliary relay is defective when an absolute value of the current flowing between the battery and the inverter is greater than a first critical value and is less than a third critical value, and the difference between the voltage of the battery and the voltage of the inverter is less than a second critical value.

The relay defect determination unit may determine that the positive main relay and the auxiliary relay are defective when an absolute value of the current flowing between the battery and the inverter is greater than a third critical value, and the difference between the voltage of the battery and the voltage of the inverter is less than a second critical value.

The signal corresponding to the state of the relay may include a voltage of a coil that turns on or off the relay.

The BMS may further include a communication unit for receiving the signal corresponding to the state of the relay from a vehicle control unit (VCU) that controls an ON or OFF state of the relay.

According to one or more embodiments of the present invention, a battery management system (BMS) includes a positive main relay, a negative main relay, and an auxiliary relay that are connected to a battery including at least one pack formed of a plurality of battery cells and that are connected between the battery and an inverter, a voltage determination unit for measuring a voltage of the battery and a voltage of the inverter, in response to a signal corresponding to a state of at least one relay from among the positive main relay, the negative main relay, and the auxiliary relay, a current determination unit for measuring a current flowing between the battery and the inverter, in response to the signal, and a relay defect determination unit for determining a defect of the at least one relay from among the positive main relay, the negative main relay, and the auxiliary relay according to the current and a difference between the voltage of the battery and the voltage of the inverter.

According to a signal corresponding to an OFF state of all of the positive main relay, the negative main relay, and the auxiliary relay, the relay defect determination unit may determine that the at least one relay from among the positive main relay, the negative main relay, and the auxiliary relay is defective when an absolute value of the current is greater than a first critical value, or the difference between the voltage of the battery and the voltage of the inverter is less than a second critical value.

According to a signal corresponding to an ON state of the auxiliary relay, the relay defect determination unit may determine that the negative main relay is defective when an absolute value of the current flowing between the battery and the inverter is greater than a first critical value, or the difference between the voltage of the battery and the voltage of the inverter is less than a second critical value.

According to a signal corresponding to an OFF state of the auxiliary relay and a signal corresponding to an ON state of the negative main relay, the relay defect determination unit may determine that the auxiliary relay is defective when an absolute value of the current flowing between the battery and the inverter is greater than a first critical value and is less than a third critical value, and the difference between the voltage of the battery and the voltage of the inverter is less than a second critical value.

According to a signal corresponding to an OFF state of the auxiliary relay and a signal corresponding to an ON state of the negative main relay, the relay defect determination unit may determine that the positive main relay and the auxiliary relay are defective when an absolute value of the current flowing between the battery and the inverter is greater than a third critical value, and the difference between the voltage of the battery and the voltage of the inverter is less than a second critical value.

The first critical value may be 1 ampere (A), the second critical value may be a voltage value corresponding 2% of the voltage of the battery, and the third critical value may be 27.7 A.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Reference will now be made in detail to embodiments, examples of which are illustrated in the accompanying drawings. In the following description, well-known functions or constructions are not described in detail so as not to obscure the invention with unnecessary detail.

Also, terms or words used in the following description should not be construed as being limited to common or general meanings but should be construed as fully satisfying the concept of the invention.

In a vehicle using electric energy, battery performance directly affects vehicle performance, so that it is necessary for each battery cell to exhibit excellent performance, and it is also necessary to arrange a battery management system (BMS) capable of efficiently managing charging and discharging of each battery cell by measuring a voltage of each battery cell, and a voltage and a current of the battery.

Figure 1:
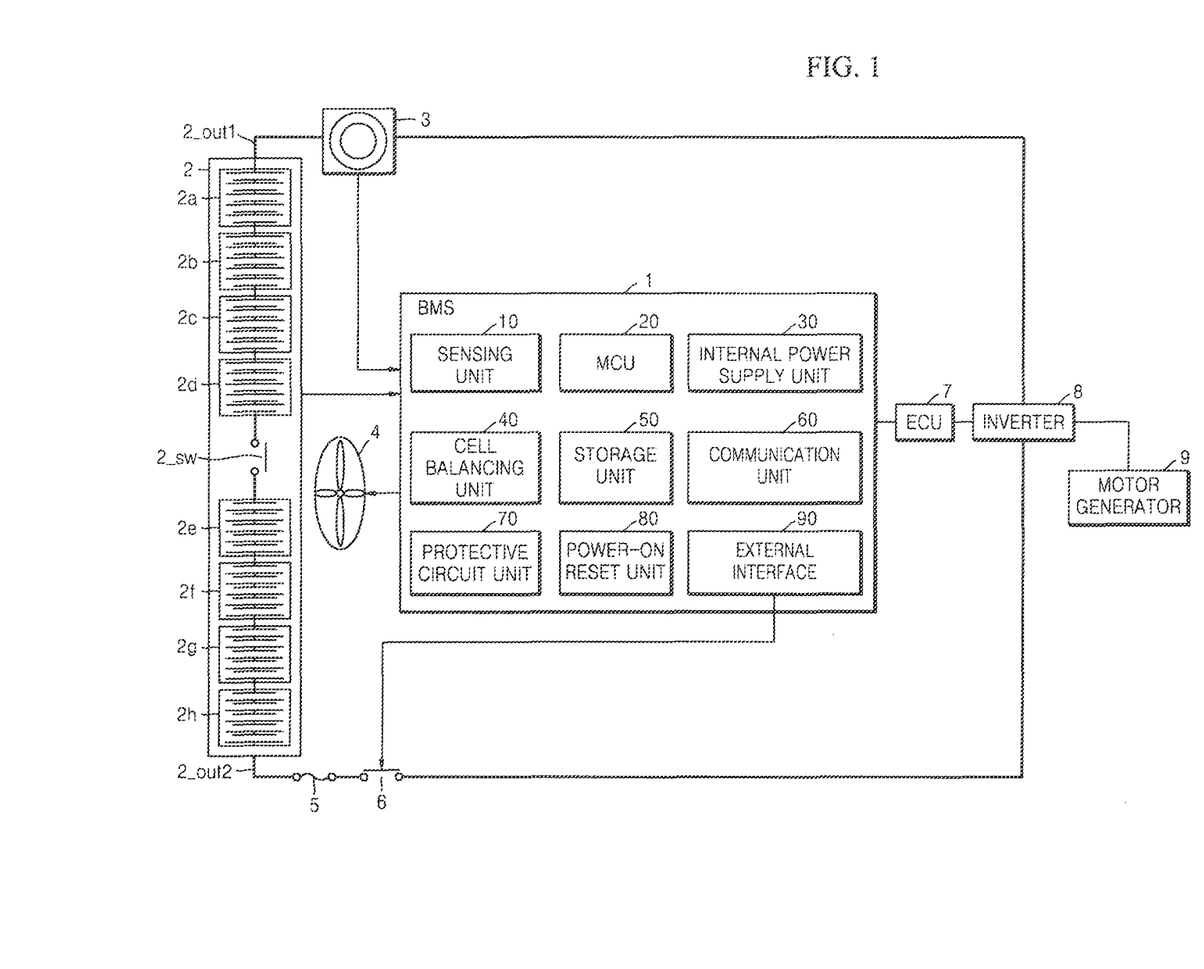
FIG. 1 schematically illustrates a battery, a battery management system (BMS), and peripheral apparatuses of the BMS, constructed as an embodiment according to the principles of the present invention.

FIG. 1 schematically illustrates a battery, a battery management system (BMS) 1, and peripheral apparatuses of the BMS 1, constructed as an embodiment according to the principles of the present invention.

As illustrated in FIG. 1, a vehicle system includes the BMS 1, a battery 2, a current sensor 3, a cooling fan 4, a fuse 5, a main switch 6, an engine controller unit (ECU) 7, an inverter 8, and a motor generator 9.

First, the battery 2 includes a plurality of sub-packs 2a through 2h in which a plurality of battery cells are connected in series, an output terminal 2_out1, an output terminal 2_out2, and a safety switch 2_sw arranged between the sub-pack 2d and the sub-pack 2e. In FIG. 1, although the number of the sub-packs 2a through 2h is eight (8), and each of the sub-packs 2a through 2h is a group of a plurality of battery cells, one or more embodiments are not limited thereto. The safety switch 2_sw is between the sub-pack 2d and the sub-pack 2e and may be manually turned on or off for an operator's safety when the operator replaces a battery or performs an operation on the battery. In the present embodiment, the safety switch 2_sw is arranged between the sub-pack 2d and the sub-pack 2e, but one or more embodiments are not limited thereto. The output terminal 2_out1 and the output terminal 2_out2 are connected to the inverter 8.

The current sensor 3 measures a current output from the battery 2 and outputs a signal to a sensing unit 10 of the BMS 1. In more detail, the current sensor 3 may be a Hall effect current transformer (Hall CT) that measures a current by using a Hall effect device and outputs an analog current signal corresponding to the measured current.

The cooling fan 4 reduces a heat generated by charging and discharging of the battery 2, based on a control signal from the BMS 1, so that the cooling fan 4 prevents deterioration of the battery 2 and a decrease of a charging and discharging efficiency due to a rise in temperature.

The fuse 5 prevents an over current from being delivered to the battery 2 due to disconnection or a short in the battery 2. That is, when the over current is generated, the fuse 5 is disconnected.

When an abnormal situation including an over voltage, an over current, a high temperature, and the like occurs, the main switch 6 turns the battery 2 on or off based on a control signal from the BMS 1 or from the ECU 7 of the vehicle system.

The BMS 1 includes the sensing unit 10, a main control unit (MCU) 20, an internal power supply unit 30, a cell balancing unit 40, a storage unit 50, a communication unit 60, a protective circuit unit 70, a power-on reset unit 80, and an external interface 90. Also, the BMS 1 determines a defect in or adhesion of relays such as a main relay and an auxiliary relay that are connected between the battery 2 and the inverter 8. The sensing unit 10 measures an entire battery pack current (hereinafter, referred to as 'battery current'), an entire battery pack voltage (hereinafter, referred to as 'battery voltage'), a pack temperature, and an ambient temperature of a cell, and then delivers a result of the measurement to the MCU 20. Also, the sensing unit 10 measures a voltage of the inverter 8 and delivers it to the MCU 20.

The MCU 20 calculates a state of charging (SOC) or a resistance change in the battery 2 based on the battery current, the battery voltage, a cell voltage, a cell temperature, and the ambient temperature of each battery cell, and then calculates a state of aging or a state of health (SOH), so that the MCU 20 generates information indicating a state of the battery 2.

The internal power supply unit 30 supplies power to the BMS 1 by using an auxiliary battery. The cell balancing unit 40 balances charging states of the battery cells. That is, if an SOC of a battery cell is relatively high, the cell balancing unit 40 may discharge the battery cell, and if an SOC of a battery cell is relatively low, the cell balancing unit 40 may charge the battery cell. When the power of the BMS 1 is off, the storage unit 50 stores a plurality of pieces of data regarding a current SOC, a current SOH, and the like. Here, the storage unit 50 is a non-volatile storage device capable of being electrically written to and erased and may be an electrically erasable programmable read-only memory (EEPROM). The communication unit 60 performs communication with the ECU 7 of the vehicle system. That is, the communication unit 60 transmits information about the SOC and the SOH to the ECU 7, or receives information about a state of a vehicle from the ECU 7 and then transmits the information to the MCU 20. The protective circuit unit 70 protects the battery 2 from an external shock, an over current, a low voltage, and the like by using firm ware. When the power of the BMS 1 is on, the power-on reset unit 80 resets the vehicle system. The external interface 90 is a device for connecting auxiliary apparatuses of the BMS 1, which are the cooling fan 4, the main switch 6, and the like, to the MCU 20. In the present embodiment, only the cooling fan 4 and the main switch 6 are illustrated but the auxiliary apparatuses are not limited thereto. The ECU 7 recognizes a current operation state of the vehicle, based on the vehicles acceleration, braking, speed and the like, and then determines information, such as torque needs of the vehicle. In more detail, the current operation state of the vehicle refers to a key on state (whether the vehicle is turned on), a key off state (whether the vehicle is turned off), a current velocity of the vehicle, a current acceleration of the vehicle, and the like. The ECU 7 transmits the current operation state to the communication unit 60 of the BMS 1. The ECU 7 controls output of the motor generator 9, according to the torque information. That is, the ECU 7 controls switching of the inverter 8 and controls the output of the motor generator 9, to match the torque information. Also, the ECU 7 receives the SOC of the battery 2 from the MCU 20, via the communication unit 60, and controls the SOC of the battery 2 according to a target value (e.g., 55%). For example, when the SOC transmitted from the MCU 20 is 55%, or less, the ECU 7 controls the inverter 8 to output power to the battery 2, so as to charge the battery 2. In this example, the ECU 7 may set a current Ib of the battery 2 as a negative value. Meanwhile, when the SOC is greater than 55%, the ECU 7 controls the inverter 8 to output power to the motor generator 9, so as to discharge the battery 2. In this example, the ECU 7 may set the current Ib of the battery 2 as a positive value.

The inverter 8 causes the battery 2 to be charged or discharged, based on a control signal from the ECU 7.

The motor generator 9 drives the vehicle using the electric energy of the battery 2, based on torque information transmitted from the ECU 7.

The ECU 7 charges or discharges the battery 2, based on the SOC, so as to prevent the battery 2 from being overcharged or overdischarged, to prolong the usable life of the battery 2. However, after the battery 2 is mounted to the vehicle, it is difficult to measure the actual SOC of the battery 2. Thus, the BMS 1 accurately estimates the SOC by using the battery voltage, the battery current, and the battery cell temperature, sensed by the sensing unit 10, and then the BMS 1 transmits the estimated SOC to the ECU 7.

Figure 2:
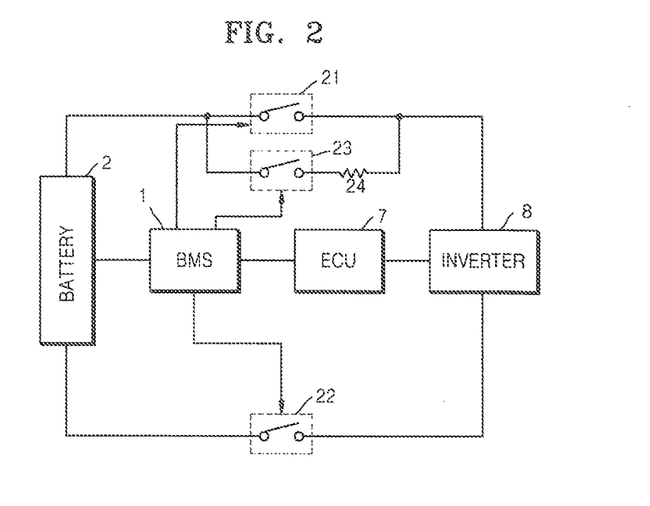
FIG. 2 is a diagram describing control of a state of a relay between a battery and an inverter, constructed as an embodiment according to the principles of the present invention.

FIG. 2 is a diagram describing control of a state of a relay between the battery 2 and the inverter 8, as an embodiment according to the principles of the present invention.

Referring to FIG. 2, a positive main relay 21 and a negative main relay 22 are connected between the battery 2 and the inverter 8, and an auxiliary relay 23 and a resistor 24 are connected in parallel with the positive main relay 21.

Each of the relays 21 through 23 are turned on or off according to control by the BMS 1. Although FIG. 1 and the description thereof describe that each of the relays 21 through 23 are turned on or off according to the control by the BMS 1, one or more embodiments are not limited thereto and thus each of the relays 21 through 23 may be controlled by a vehicle control unit (VCU) (not shown).

FIG. 2 illustrates a connection configuration of the battery 2 and the inverter 8 for a general electric vehicle or a general hybrid vehicle, and the connection configuration includes the battery 2, the auxiliary relay 23, the positive and negative main relays 21 and 22, and the inverter 8.

The battery 2 supplies a high voltage and a high current to the inverter 8 via the positive and negative main relays 21 and 22. The auxiliary relay 23 indicates a relay for pre-charging and is arranged to check a state of the battery 2 when the battery 2 and the inverter 8 are initially connected, and to prevent an over current from flowing to the inverter 8. When the auxiliary relay 23 is turned off, the positive main relay 21 is turned on and supplies a power of the battery 2 to the inverter 8. The auxiliary relay 23 has a smaller quantity than the positive main relay 21, and when the battery 2 and the inverter 8 are initially connected, the auxiliary relay 23 is turned on for a moment and then is turned off. The resistor 24 prevents an over current that flows to the inverter 8 as soon as the auxiliary relay 23 is turned on. The inverter 8 converts the power supplied from the battery 2, thereby driving a motor. Although not illustrated, a condenser having a large capacity may be mounted on a front end of the inverter 8 so as to smooth variation of a voltage of the inverter 8 and to stabilize an operation of the inverter 8.

The BMS 1 recognizes a defect of the relays 21 through 23 and determines which relay is defective, based on a signal according to an ON or OFF state of each of the relays 21 through 23, e.g., based on a voltage signal applied to a coil (not shown) that operates the relays 21 through 23, a battery current thereof, and a voltage difference between the battery 2 and the inverter 8.

Figure 3:
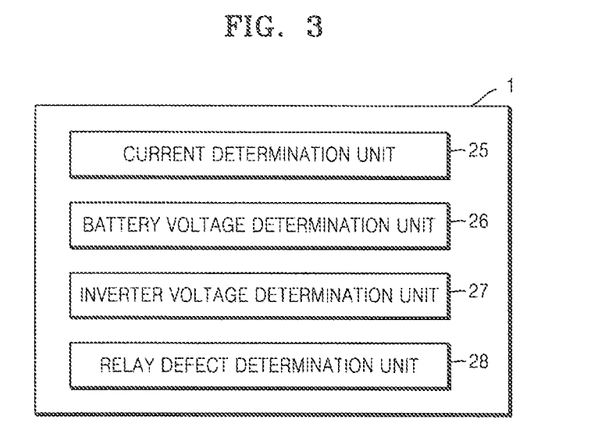
FIG. 3 schematically illustrates the BMS of FIG. 2, as an embodiment according to the principles of the present invention.

FIG. 3 schematically illustrates the BMS 1 of FIG. 2.

Referring to FIG. 3, the BMS 1 includes a current determination unit 25, a battery voltage determination unit 26, an inverter voltage determination unit 27, and a relay defect determination unit 28. Here, although the units are described according to their functions, battery voltage determination and inverter voltage determination may be embodied as one module.

When a signal according to a relay state is received via the communication unit 60 of the BMS 1, e.g., when the current determination unit 25 receives a signal according to a state in which all of the relays 21 through 23 are turned off, the current determination unit 25 measures a current flowing between the battery 2 and the inverter 8. Also, when the current determination unit 25 receives a signal corresponding to a case in which the auxiliary relay 23 is turned on, or a signal corresponding to a case in which the auxiliary relay 23 is turned off and the negative main relay 22 is turned on, based on the voltage signal applied to the coil that operates the relays 21 through 23, the current determination unit 25 measures the battery current. Here, the battery current includes a precharging current that flows when the auxiliary relay 23 is turned on.

The battery voltage determination unit 26 receives the signal according to the relay state, and measures a voltage of the battery 2. Similarly, the inverter voltage determination unit 27 measures a voltage applied to both end terminals of the inverter 8.

The relay defect determination unit 28 determines which relay from among the positive main relay 21, the negative main relay 22, and the auxiliary relay 23 is defective, based on the current measured by the current determination unit 25, and the voltage difference between the battery 2 and the inverter 8, which is measured by the battery voltage determination unit 26 and the inverter voltage determination unit 27.

In more detail, according to a signal corresponding to an OFF state of all of the relays 21 through 23, if an absolute value of a measured current is greater than a first critical value, and the voltage difference between the battery 2 and the inverter 8 is less than a second critical value, the relay defect determination unit 28 determines that one of the relays 21 through 23 is defective. Here, the first and second critical values may be randomly decided. For example, in consideration of accuracy of the current sensor 3, the first critical value may be 1 ampere (A) and the second critical value may be a voltage corresponding to 2% of a voltage of a battery pack. In a case where all of the relays 21 through 23 are in an OFF state, if the relays 21 through 23 normally operate, a battery current cannot flow therethrough and a voltage of the battery 2 is not applied to the inverter 8, so that the voltage difference has to be equal to or greater than a predetermined value. However, if a current flows from the battery 2 to the inverter 8 or from the inverter 8 to the battery 2, and a value thereof is greater than a predetermined value, e.g., 1 A, the relay defect determination unit 28 may determine that one of the relays 21 through 23 is defective although which one is defective is not yet determined.

Afterward, the auxiliary relay 23 is turned on again. By doing so, it is possible to check a defect state of the negative main relay 22. Therefore, in a case where an absolute value of a current flowing between the battery 2 and the inverter 8 is greater than the first critical value, and the voltage difference between the battery 2 and the inverter 8 is less than the second critical value, the relay defect determination unit 28 may determine that the negative main relay 22 is defective. Otherwise, a signal corresponding to the OFF state of the auxiliary relay 23, and an ON state of the negative main relay 21 is generated. By doing so, it is possible to check a defect state of the positive main relay 21, and also, by determining the amplitude of the precharging current, it is possible to check a defect state of the auxiliary relay 23. That is, in a case where the current flowing between the battery 2 and the inverter 8 is between the first critical value and a third critical value, and the voltage difference between the battery 2 and the inverter 8 is equal to or less than the second critical value, the relay defect determination unit 28 may determine that the auxiliary relay 23 is defective. Similarly, when the absolute value of the current flowing between the battery 2 and the inverter 8 is greater than the third critical value, and the voltage difference between the battery 2 and the inverter 8 is equal to or less than the second critical value, the relay defect determination unit 28 may determine that the positive main relay 21 and the auxiliary relay 23 are defective. Here, the third critical value may be randomly decided. Also, the third critical value may be a value of the precharging current, e.g., 27.7 A, and may vary according to the battery pack, a capacity of the inverter 8, and a value of a resistor for precharging.

Figure 4:
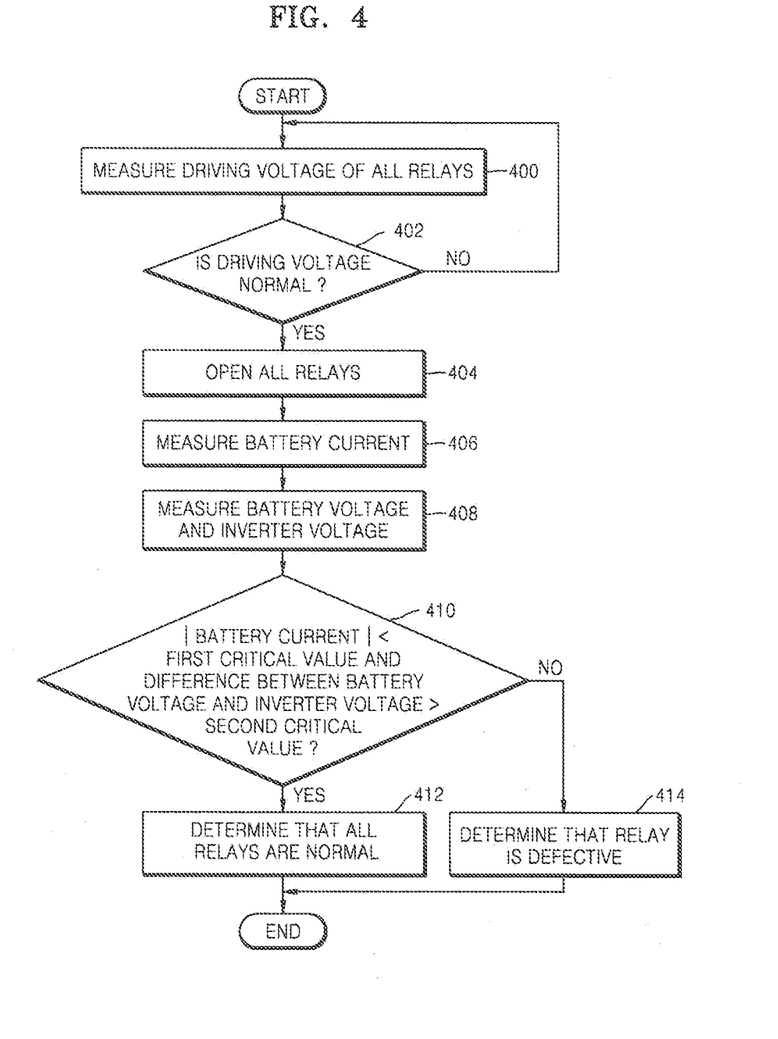
FIG. 4 is a flowchart of a method of controlling a BMS, as an embodiment according to the principles of the present invention.

FIG. 4 is a flowchart of a method of controlling a BMS, as an embodiment according to the principles of the present invention.

Referring to FIG. 4, in operations 400 and 402, the BMS measures a driving voltage for driving all relays and determines whether the driving voltage is normally supplied to the relays. That is, in order to determine whether each relay normally operates, the BMS first checks whether the driving voltage, e.g., 12 V, is normally supplied to the relays. Here, the driving voltage is supplied from the BMS or a battery pack, and the BMS or the battery pack converts or generates 12 V and supplies the driving voltage to the relays.

In operation 402, if the driving voltage is normally supplied to the relays, in operation 404, the BMS turns off, i.e., open, all of the relays. In operation 406, the BMS measures a battery current, and in operation 408, the BMS measures a battery voltage and an inverter voltage.

In operation 410, the BMS determines whether an absolute value of the battery current is less than a first critical value, and whether a difference between the battery voltage and the inverter voltage is greater than a second critical value. Here, the first critical value may be 0 A in ideal circumstances but in consideration of accuracy of a current sensor, the first critical value may be 1 A and the second critical value may be a voltage value corresponding to 2% of a voltage of the battery pack.

If a condition of operation 410 is satisfied, in operation 412, the BMS determines that the relays normally operate. That is, in a state where the relays are off, the battery current does not flow and the battery voltage is not delivered to the inverter, so that a voltage difference between both end terminals has to be equal to or greater than a predetermined value, e.g., several kV, and in this regard, if this condition is satisfied, the BMS may determine that the relays are normal.

If the condition of operation 410 is not satisfied, in operation 414, the BMS determines that the relays are defective.

Figure 5A:
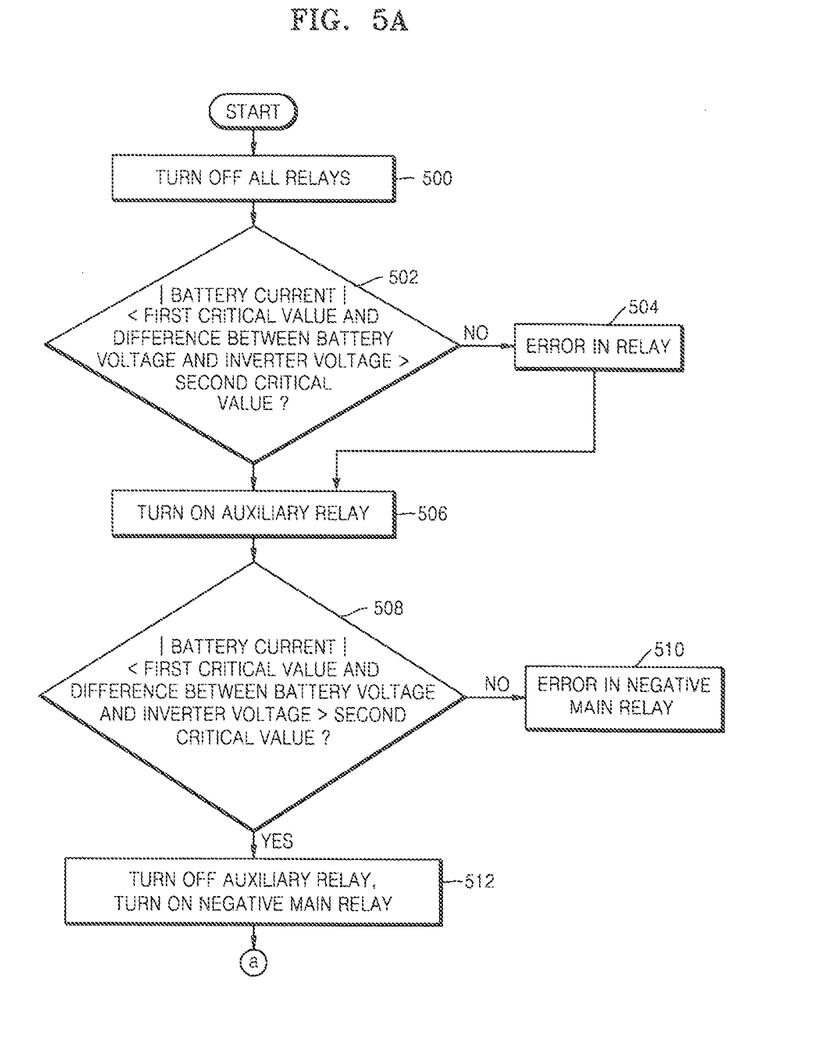
FIGS. 5A and 5B illustrate a flowchart of a method of controlling a BMS, as another embodiment according to the principles of the present invention.
Figure 5B:
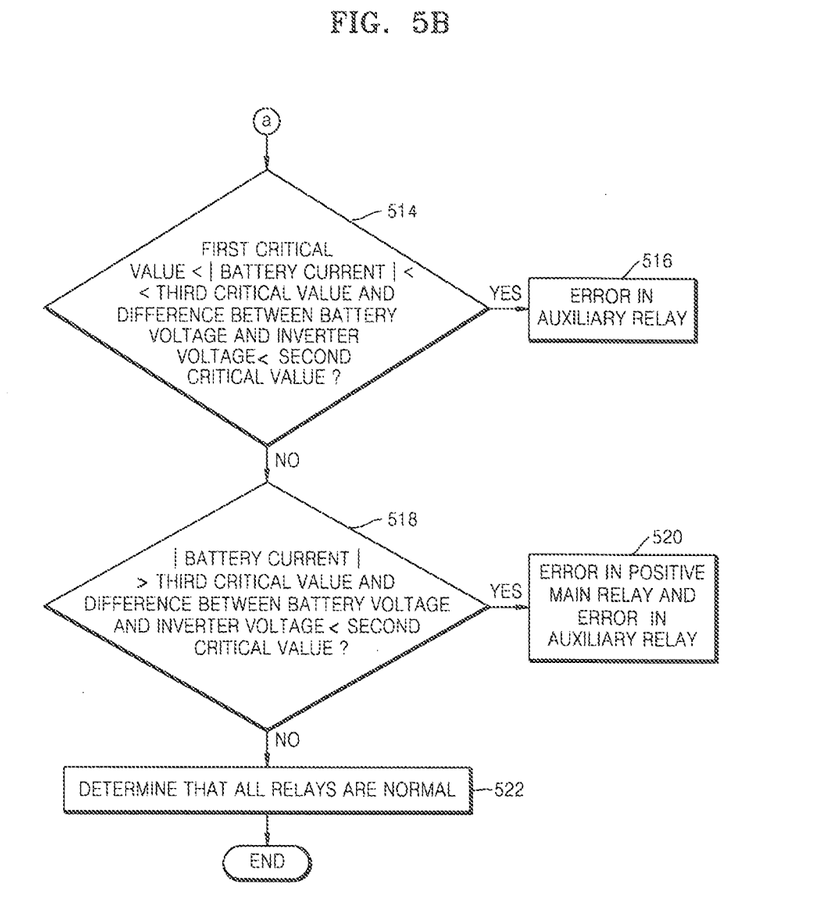

FIG. 5 is a flowchart of a method of controlling a BMS, as another embodiment according to the principles of the present invention.

Here, although operations 400 and 402 of FIG. 4 are not illustrated, the method of FIG. 5 may be implemented by including operations 400 and 402 of FIG. 4.

Referring to FIG. 5, operations 500 and 504 are the same as the embodiment of FIG. 4. Thus, when a BMS determines that relays are defective, operation 506 starts, and operations after operation 506 are performed to determine which relay or which contact point is defective.

In operation 506, the BMS turns on an auxiliary relay. In this case, the BMS may determine again a determination condition of operation 502 so that the BMS may determine whether a negative main relay is defective.

In operation 508, the BMS determines whether an absolute value of a battery current is less than a first critical value, and whether a difference between a battery voltage and an inverter voltage is greater than a second critical value. If the condition of operation 508 is not satisfied, the BMS may determine that a circuit is formed in such a manner that a path via the auxiliary relay and the negative main relay are adhered, so that, in operation 510, the BMS determines that the negative main relay is defective. If the condition of operation 508 is satisfied, in operation 512, the BMS turns off the auxiliary relay and turns on the negative main relay. In this case, the BMS may determine a defect of a positive main relay and the auxiliary relay.

In operation 514, the BMS determines whether the battery current is greater than a negative third critical value and is less than a negative first critical value or is greater than the first critical value and is less than a third critical value, and whether the difference between the battery voltage and the inverter voltage is less than the second critical value. Here, the third critical value is a value of a precharging current, and for example, the third critical value may be 27.7 A. That is, since a current flowing through the auxiliary relay is less than a current flowing through the positive main relay, the defect of the auxiliary relay is discriminated from the defect of the positive main relay according to the above condition. That is, if a current within a predetermined range flows, the BMS determines that the auxiliary relay is defective in operation 516, and if a current above the predetermined range flows, the BMS determines that the positive main relay is also defective in operation 520.

If the condition of operation 518 is not satisfied, the method proceeds to operation 522 and the BMS determines that the relays are normal.

Thus, determination of a defect of the relays according to the one or more embodiments of the present invention is performed by receiving the state information regarding the battery current and the relays and then by considering not only the state information but also considering the voltage difference between the battery and the inverter, so that a risk of failing to determine the defect due to a voltage sensing error may be decreased and accuracy of the determination may be increased. Also, whether a driving voltage of the relays is normal is checked in advance, so that reliability of the state information and reliability of voltage and current sensing may be assured.

In addition, it is possible to determine which relay is defective and to detect a relay defect regardless of the current operation state of the electric vehicle, i.e., a stop state, a driving state, or a start-up state.

The device described herein may comprise a processor, a memory for storing program data and executing it, a permanent storage device such as a disk drive, a communication port for handling communications with external devices, and user interface devices, etc. Processes may be implemented as software modules or algorithms, and may be stored as program instructions or computer readable codes executable in the processor, on a computer-readable medium such as read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. This media can be read by the computer, stored in the memory, and executed by the processor.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Functional aspects may be implemented in algorithms that are executed in one or more processors. Furthermore, the present invention may employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those of ordinary skill in this art without departing from the spirit and scope of the present invention.

What is claimed is:

1. A battery management system (BMS), comprising:
a voltage determination unit to measure a voltage of a battery and to measure a voltage of an inverter, a relay being connected between the battery and the inverter, the voltage determination unit measuring the voltage of the inverter and the voltage of the battery while the relay is being turned off;
a current determination unit to measure a current flowing between the battery and the inverter, the current determination unit measuring the current while the relay is being turned off; and
a relay defect determination unit to determine whether the relay is defective based on the current and a difference between the voltage of the battery and the voltage of the inverter, the relay defect determination unit determining that the relay is defective if an absolute value of the current is greater than a first critical value and the difference between the voltage of the battery and the voltage of the inverter is less than a second critical value, the relay defect determination unit determining whether a driving voltage of the relay is normal before measuring the current flowing between the battery and the inverter and before measuring the voltage of the battery and the voltage of the inverter.

2. The BMS of claim 1, wherein the relay comprises a positive main relay, a negative main relay, and an auxiliary relay that is connected in parallel with the positive main relay.

3. The BMS of claim 2, wherein the voltage determination unit measures the voltage of the inverter and the voltage of the battery while the positive main relay and the negative main relay are being turned off and the auxiliary relay is being turned on, the current determination unit measuring the current flowing between the battery and the inverter while the positive main relay and the negative main relay are being turned off and the auxiliary relay is being turned on, the relay defect determination unit determining that the negative main relay is defective when the absolute value of the current flowing between the battery and the inverter is greater than the first critical value and the difference between the voltage of the battery and the voltage of the inverter is less than the second critical value.

4. The BMS of claim 2, wherein the voltage determination unit measures the voltage of the inverter and the voltage of the battery while the positive main relay and the auxiliary relay are being turned off and the negative main relay is being turned on, the current determination unit measuring the current flowing between the battery and the inverter while the positive main relay and the auxiliary relay are being turned off and the negative main relay is being turned on, the relay defect determination unit determining that the auxiliary relay or the positive main relay is defective based on the current flowing between the battery and the inverter and the difference between the voltage of the battery and the voltage of the inverter.

5. The BMS of claim 4, wherein the relay defect determination unit determines that the auxiliary relay is defective when the absolute value of the current flowing between the battery and the inverter is greater than the first critical value and is less than a third critical value, and the difference between the voltage of the battery and the voltage of the inverter is less than the second critical value.

6. The BMS of claim 4, wherein the relay defect determination unit determines that the positive main relay and the auxiliary relay are defective when the absolute value of the current flowing between the battery and the inverter is greater than a third critical value, and the difference between the voltage of the battery and the voltage of the inverter is less than the second critical value.

7. The BMS of claim 1, wherein the signal corresponding to the state of the relay comprises a voltage of a coil that turns on or off the relay.

8. The BMS of claim 1, further comprising a communication unit for receiving the signal corresponding to the state of the relay from a vehicle control unit (VCU) that controls a turned on or turned off state of the relay.

9. A battery management system (BMS), comprising:
a voltage determination unit to measure a voltage of a battery and a voltage of an inverter, each of a positive main relay, a negative main relay, and an auxiliary relay being connected between the inverter and the battery, the auxiliary relay connected in parallel with the positive main relay, the voltage determination unit measuring the voltage of the inverter and the voltage of the battery while all of the positive main relay, the negative main relay, and the auxiliary relay are being turned off;
a current determination unit to measure a current flowing between the battery and the inverter, the current determination unit measuring the current while all of the positive main relay, the negative main relay, and the auxiliary relay are being turned off; and
a relay defect determination unit to determine whether at least one of the positive main relay, the negative main relay, and the auxiliary relay is defective based on the current and a difference between the voltage of the battery and the voltage of the inverter, the relay defect determination unit determining that at least one of the positive main relay, the negative main relay, and the auxiliary relay is defective if an absolute value of the current is greater than a first critical value and the difference between the voltage of the battery and the voltage of the inverter is less than a second critical value.

10. The BMS of claim 9, wherein the voltage determination unit measures the voltage of the inverter and the voltage of the battery while the positive main relay and the negative main relay are being turned off and the auxiliary relay is being turned on, the current determination unit measuring the current flowing between the battery and the inverter while the positive main relay and the negative main relay are being turned off and the auxiliary relay is being turned on, the relay defect determination unit determining that the negative main relay is defective when the absolute value of the current flowing between the battery and the inverter is greater than a first critical value and the difference between the voltage of the battery and the voltage of the inverter is less than a second critical value.

11. The BMS of claim 9, wherein the voltage determination unit measures the voltage of the inverter and the voltage of the battery while the positive main relay and the auxiliary relay are being turned off and the negative main relay is being turned on, the current determination unit measuring the current flowing between the battery and the inverter while the positive main relay and the auxiliary relay are being turned off and the negative main relay is being turned on, the relay defect determination unit determining that the auxiliary relay is defective when the absolute value of the current flowing between the battery and the inverter is greater than the first critical value and is less than a third critical value, and the difference between the voltage of the battery and the voltage of the inverter is less than the second critical value.

12. The BMS of claim 9, wherein the voltage determination unit measures the voltage of the inverter and the voltage of the battery while the positive main relay and the auxiliary relay are being turned off and the negative main relay is being turned on, the current determination unit measuring the current flowing between the battery and the inverter while the positive main relay and the auxiliary relay are being turned off and the negative main relay is being turned on, the relay defect determination unit determining that the positive main relay and the auxiliary relay are defective when the absolute value of the current flowing between the battery and the inverter is greater than a third critical value, and the difference between the voltage of the battery and the voltage of the inverter is less than the second critical value.

13. The BMS of claim 11, wherein the first critical value is 1 ampere (A), the second critical value is a voltage value corresponding 2% of the voltage of the battery, and the third critical value is 27.7 A.

* * * * *